(12) United States Patent
Ryan

(10) Patent No.: US 6,359,946 B1
(45) Date of Patent: Mar. 19, 2002

(54) CLOCK SYNCHRONIZATION FOR ASYNCHRONOUS DATA TRANSMISSION

(75) Inventor: Arthur Ryan, Round Rock, TX (US)

(73) Assignee: National Instruments Corp., Austin, TX (US)

(*) Notice: Subject to any disclaimer, the term of this patent is extended or adjusted under 35 U.S.C. 154(b) by 0 days.

(21) Appl. No.: 09/159,269

(22) Filed: Sep. 23, 1998

(51) Int. Cl.$^7$ ................................................ H04L 7/00
(52) U.S. Cl. ........................ 375/371; 375/354; 375/357; 327/141; 327/503
(58) Field of Search .................................. 375/354, 371, 375/357; 341/101, 100; 326/94; 327/141; 713/400; 370/503

(56) References Cited

U.S. PATENT DOCUMENTS

| | | | | |
|---|---|---|---|---|
| 4,935,942 A | * | 6/1990 | Hwang et al. | 375/354 |
| 5,036,221 A | * | 7/1991 | Brucculeri et al. | 326/94 |
| 5,459,419 A | * | 10/1995 | Hatakenaka | 327/141 |
| 5,729,719 A | * | 3/1998 | Gates | 713/400 |

OTHER PUBLICATIONS

Nash, G., AN535 Application Note titled, "Phase–Locked Loop Design Fundamentals," Motorola, Inc., 7/93, pp. 1–13.
Mukherjee, A., "Introduction to nMOS and CMOS VLSI Systems Design," Prentice–Hall, Englewood Cliffs, N.J., 1986, pp. 104–112.
Horowitz, et al. "The Art of Electronics," Cambridge University Press 1980, pp. 428–437.
Motorola: Fast and LS TTL Data Prepared by Motorola Technical Information Center, Series G, Motorola Inc., 1989, pp. 5–131 to 5–140.
McCluskey, E., "Logic Design Principles: With Emphasis on Testable Semicustom Circuits," Prentice–Hall, Englewood Cliffs, New Jersey, 1986, pp. 303–305.

* cited by examiner

*Primary Examiner*—Stephen Chin
*Assistant Examiner*—Shuwang Liu
(74) *Attorney, Agent, or Firm*—Conley, Rose & Tayon, PC; Robert C. Kowert

(57) ABSTRACT

An apparatus for receiving an asynchronous data signal may include a clock generator that generates a clock signal having a frequency approximately equal to the bit rate of the asynchronous data signal. An edge detector may detect transitions of the asynchronous data signal. A dead-band detector may detect when a transition of the clock signal used to sample the data signal occurs within a predetermined amount of time of a transition of the asynchronous data signal so that data sampled on that transition of the clock signal may be invalid. The phase of the clock signal may be adjusted if the transition of the clock signal occurs within this predetermined amount of time. The clock generator may include two programmable counters, one which may be programmed with a bit-rate value so that it generates a signal approximately matching the bit rate of the asynchronous data signal, and the other programmed with a phase-delay value so that it generates a sample clock signal at a phase delay from the signal generated by the first counter. The phase of the sample clock may be adjusted by restarting the counters in response to a transition on the asynchronous data signal. Data may be supplied to a serial-to-parallel converter including a first shift register configured to shift a data word in serially and output the data word in parallel and a second shift register configured to track when the data word had been completely shifted into the first shift register.

22 Claims, 7 Drawing Sheets

CLOCK SYNCHRONIZATION FOR ASYNCHRONOUS DATA TRANSMISSION

FIELD OF THE INVENTION

The present invention relates to the field of data transmission, and more particularly, to synchronizing to asynchronous data transmissions. One embodiment is related to synchronizing a sampling clock to an asynchronous serial digital data stream.

DESCRIPTION OF THE RELATED ART

Asynchronous serial digital transmission is a common form for transferring information in the telecommunication industry. A device that is receiving an asynchronous stream of data must sample the data stream at times when the data is stable in order to guarantee accurate reception of the data stream. A typical receiving device may use an internal sampling clock to sample the serial data stream. However, an asynchronous serial data stream is, by its nature, asynchronous to the internal sampling clock. Therefore, if the data stream is simply sampled on edges of the internal clock, the receiving device may not be assured that each time data is sampled, correct data will be received. This is because even though the frequency of the internal clock may be the same as the data stream transmission rate, the phase between the sampling clock and the data stream may drift so that clock edges of the sampling clock occur during times when data on the data stream is unstable. Therefore, it would be desirable for a device that is receiving an asynchronous stream of data to somehow synchronize its internal sampling clock to the incoming asynchronous data in such a way as to guarantee that the serial data is stable when it is sampled. Moreover, it is desirable that the synchronization process be done in a way such that data is not lost.

If the incoming serial data stream is well defined in terms of bit rate, transmission time, and threshold values, and this information is known to the receiving device, then the synchronization problem is simplified. However, the problems of synchronization are compounded if no assumptions can be made about the incoming serial data stream. For example, if a receiving device must be capable of receiving asynchronous data streams at different transmission rates, then the synchronization logic must be able to handle changes in the transmission rate. Traditional synchronization solutions such as a phase locked loops are ineffective for synchronizing to an asynchronous serial digital data stream. This is because a phase locked loop must synchronize to a periodic reference. However, an asynchronous digital data stream may not be periodic. For example, if the bit stream 10011 is transmitted, there is no transition edge in the data stream for two consecutive bit periods. The problem is exacerbated when long strings of zeros or ones are transmitted. Therefore, a traditional phase locked loop would not be able to maintain synchronization. Thus, it is desirable to have a receiving device for receiving an asynchronous data signal that samples the data signal at times when each bit is stable without missing any bits. To accomplish this, it would be desirable to be able to synchronize an internal sampling clock to an asynchronous data signal.

Furthermore, conventional phase locked loops may require several clock cycles to synchronize. Thus, data may be lost for the periods before synchronization is completed. Thus, it is desirable to shorten the amount of time required to synchronize. Preferably, synchronization (or phase locking) would occur immediately.

If the asynchronous data stream is a serial digital data stream, once the data is received it may be necessary to convert the data from a serial format to a parallel format. Also, if data is to be transmitted from the same device it may be necessary to convert parallel data into serial data for transmission. Similarly, if parallel data is received as the transmitted data, in some applications it may be desirable to convert to serial data and vice versa. Typically, a shift register is used to convert data from a serial format to a parallel format or from a parallel format to a serial format. Typically the shift register is of a fixed length and a counter is used to indicate when all the bits in the shift register have been shifted in or out. However, if the length of data words to be converted is not a fixed value then a conventional fixed length shift register and counter may not be used. Likewise, if the word length of the data must be dynamically altered, a fixed length shift register and counter are inappropriate. Furthermore, as the length of the word to be converted increases, so must the complexity of the counter used to track the status of the conversion. In high speed applications involving long data words the counter size may be prohibitive as to the speed at which the parallel-to-serial or serial-to-parallel converter may operate.

It would thus be desirable to have a general purpose serial-to-parallel or parallel-to-serial converter that provides the capability to convert the data format for variable word sizes. Also, it would be desirable for the data converter to scale with changes in the word size with negligible impact on performance.

Devices for receiving and/or transmitting serial data streams may often be implemented as custom circuit designs. However, when it becomes necessary to upgrade the device to a new process or new technology or to provide for faster transmission rates or different data formats, such custom designs may not scale well in terms of size and performance. A custom logic design that works for one type of semiconductor component, such as a gate array employing a certain process and operating frequency, may not operate if the process or operating frequency is changed. It would be desirable to have a design for sampling asynchronous data transmissions and converting the data stream from serial-to-parallel or parallel-to-serial formats where the design is easily scaled to different device processes operating speeds and architectures.

SUMMARY

Synchronization logic for synchronizing a sample clock to an asynchronous data sample is described. One embodiment of the synchronization logic may include a counter for measuring the time between a transition edge of the data on the asynchronous data signal and a sample edge of the sample clock. If the time between these two events is less than a dead-band value or if these two events occur concurrently, then a warning signal may be generated to indicate that the sample clock edge occurred too close to the data transition to ensure that the data sample will be valid. The warning signal may be used to readjust the phase of the sample clock so that sample transitions will occur during times when the data is stable on the asynchronous data signal.

Sample clock synchronization logic for sampling an asynchronous data signal may include a bit-rate counter which creates a terminal count clock signal that approximately matches the data rate frequency of the asynchronous data signal. A phase delay counter may be used to generate the sample clock signal at a phase delay from the terminal count clock signal provided by the bit-rate counter. An edge detector may be provided to determine when a transition occurs on the asynchronous data signal. The edge detector may provide an edge signal to glue logic to indicate when such a data transition has occurred. The glue logic may then cause the bit-rate counter and phase delay counter to be restarted so that the phase of the sample clock is readjusted. This will cause the sample clock edge to occur at approximately the phase delay count value from the edge of the data transition on the asynchronous data signal, thus assuring correct sampling.

The bit-rate counter may be programmable such that a bit-rate value is loaded into the bit-rate counter to select the frequency at which the terminal count clock signal will be generated. Also, a subtracter may be employed to subtract the count value of the bit-rate counter from the programmed bit-rate value. The difference from the subtracter may be compared to a dead-band value to determine if the sample clock transition will occur too close to an edge on the asynchronous data signal. If it is determined that the sample clock edge will occur too close to a data transition, then a warning signal may be generated.

An apparatus for receiving an asynchronous data signal is contemplated. The apparatus may include a clock signal generator configured to generate a clock signal having a frequency approximately equal to the bit rate of the asynchronous data signal. Also, circuitry may be included for receiving the asynchronous data signal at times determined by a transition of the clock signal. An edge detector may be configured to detect a transition of the asynchronous data signal and a dead-band detector may be coupled to the clock signal generator and to the edge detector for detecting when the transition of the clock signal occurs within a predetermined amount of time of the transition of the asynchronous data signal. The phase of the clock signal may be adjusted if the transition of the clock signal occurs within the predetermined amount of time of the transition of the asynchronous data signal. The dead-band detector may be further configured to assert a bad sample signal or and edge-too-close signal when the transition of the clock signal occurs within the predetermined amount of time of the transition of the asynchronous data signal. The bad sample signal may allow the apparatus to take corrective action such as resembling the asynchronous data signal or ignoring a potential bad sample. The edge detector may be configured to assert an edge signal upon detection of the transition of the asynchronous data signal, and the phase of the clock signal may be adjusted in response to the edge signal. The edge detector may be configured to assert the bad sample signal when the transition of the clock signal occurs within the predetermined amount of time before assertion of the edge signal or concurrently therewith.

The clock signal generator may comprise a bit-rate counter configured to generate a count signal corresponding to the bit rate of the asynchronous data signal. The clock signal generator may also include a phase counter adapted to generate the clock signal at a phase delay from the count signal. The bit-rate counter and phase counter may be reset in response to a transition of the asynchronous data signal. Also, the phase counter and bit rate counter may be programmable such that a phase value may be loaded into the phase counter to select the phase delay and a bit-rate value may be loaded into the bit-rate counter select the frequency of the count signal to match the frequency of the asynchronous data signal.

The dead-band detector may comprise a subtracter configured to subtract a count value from the bit-rate value and output the difference. The count value may be the count of the bit-rate counter. The dead-band detector may also include a comparitor to compare the difference from the subtracter to a dead-band value. The difference indicates how close the transition of the clock signal occurs to the transition of the asynchronous data signal. The dead-band value may represent the predetermined amount of time. The circuitry configured to receive the asynchronous data signal may include a serial-to-parallel converter. The serial-to-parallel converter may include one or more shift registers which may be clocked by the clock signal.

A method for synchronizing a clock signal to an asynchronous data signal is contemplated. The method may include generating a clock signal where the frequency of the clock signal is selected to be approximately equal to the bit rate of the asynchronous data signal. The method may also include detecting a transition of the asynchronous data signal and detecting if a sample transition of the clock signal occurs within a predetermined amount of time of the transition of the asynchronous data signal. An indication of such an event may be generated. The method also may include adjusting the phase of the clock signal so that the next sample transition of the clock signal will occur a phase delay from the transition of the asynchronous data signal. Generating a clock signal may include counting for a time period corresponding to the bit rate of the asynchronous data signal and generating a terminal count signal when the time period is reached. Generating a clock signal may also include counting for a phase delay from the terminal count signal and asserting the clock signal when the phase delay is reached. Adjusting the phase of the clock signal may include restarting the counting for a time period and counting for the phase delay in response to detecting a transition of the asynchronous data signal. Generating a clock signal may further include loading a first programmable counter with a bit-rate count value corresponding to the bit rate of the asynchronous data signal and loading a second programmable counter with a phase delay counting value corresponding to the phase delay. Detecting if a sample transition of the clock signal occurs within a predetermined time of the transition of the asynchronous data signal may include subtracting a count value from the bit-rate count value and outputting the difference. The bit-rate count value may be provided by the counting for a time period as described above. The detecting may also include comparing the difference from the subtracting to a dead-band value. The difference indicates how close the sample transition of the clock signal occurs to the transition of the asynchronous data signal and the dead-band value represents the predetermined amount of time described above. The frequency of the clock signal may be changed in response to a change, or anticipated change, in the bit rate of the asynchronous data signal. This may be performed by loading a new bit-rate count value into a bit-rate counter.

The clock synchronization techniques described above may be employed in conjunction with a serial-to-parallel data converter. A serial-to-parallel data converter may include a first shift register configured to shift in a data word (from the asynchronous data signal) and output the data word in parallel. The serial-to-parallel converter may also include a second shift register configured to track when the data word has been completely shifted into the first shift register and to cause the data word to be outputted in parallel form from the first shift register. The second shift register may be programmable so that it may be loaded with a value corresponding to the number of bits in the data word to be converted. This value may be shifted in the second shift register each time a bit of the data word is shifted into the first shift register so that an output indication is shifted out of the second shift register as the last bit of the data word is shifted into the first shift register. The first shift register may be configured to convert data words of varying bit lengths from serial-to-parallel format. The bit size of the first shift register may be equal to the maximum bit length to be converted. The second shift register may be adapted to track different bit lengths by receiving different shift status words corresponding to the bit length of the data word to be converted. Thus, by changing the status word loaded into the second shift register, the bit length to be converted may be changed dynamically.

A parallel-to-serial converter is also contemplated. The parallel-to-serial converter may include a first shift register configured to receive a data word in parallel and shift out the data word serially. A second shift register may also be included, configured to track when the data word has been completely shifted out of the first shift register and to cause a new data word to be loaded in parallel into the first shift register. The second shift register may be loaded with a value corresponding to the number of bits in the data word. This value may be shifted in the second shift register each time a bit of the data word is shifted out of the first shift register so that a load indication is shifted out of the second shift register when the last bit of the data word is shifted out of the first shift register. This load indication may be used to indicate when a new parallel word and shift status value may be loaded into the first and second shift registers respectively. The first shift register may be configured to convert data words of various bit lengths from parallel-to-serial format. The bit size of the first shift register may be equal to the maximum bit length to be converted. The second shift register may be adapted to track different bit length by receiving a shift status word corresponding to the bit length of the data word to be converted. Thus, by loading a different shift status word or value into the second shift register, the bit length to be converted may be changed dynamically.

A data converter is also contemplated including a first shift register configured to perform a data conversion by shifting in a data word serially and outputting the data word in parallel, or receiving the data word in parallel and outputting serially, as determined by a direction signal. A second shift register may be configured to track when the data conversion has been completed and to cause the data conversion to be performed on the next data word. A second shift register may be loaded with a value corresponding to the number of bits in the data word to be converted. This value is shifted in the second shift register each time a bit of the data word is shifted into or out of the first shift register so that a conversion complete indication is shifted out of the second shift register when the last bit of the data word is converted in the first shift register. The first shift register may be configured to convert data words of varying bit lengths and the bit size of the first shift register may be equal to the maximum bit length to be converted. The second shift register may be adapted to track different bit lengths by receiving a shift status word corresponding to the bit length of the data word to be converted. Thus, the bit length to be converted may be changed dynamically by changing the value of the shift status word.

Also contemplated is a method for tracking the conversion of a data word from parallel-to-serial or from serial-to-parallel format. The method includes shifting a data word in to or out of a first shift register according to a conversion type indication. The method also includes shifting a value in the second shift register each time data in the first shift register is shifted. The method includes outputting a conversion complete indication from the second shift register when the conversion is complete. This conversion complete indication may be used to indicate when conversion of a new data word may begin. The method may also include loading the second shift register with a value corresponding to the number of bits in the data word to be converted. The first shift register may be configured to convert data words of varying bit lengths where the bit size of the first shift register is equal to the maximum bit length to be converted. The method may also include dynamically changing the data word bit length to be converted by changing the value loaded in the second shift register between conversions.

The logic for synchronizing a sample clock to an asynchronous data stream and the data converters described above may be used in conjunction in a device for receiving and/or transmitting serial data. For example, the sample clock synchronized to the asynchronous data stream may be used to indicate when the asynchronous data should be shifted in to the serial-to-parallel converter as described above to insure that valid data samples are shifted into the shift register. Also, the parallel-to-serial converter described may be employed to convert parallel data received from, for example, a computer interface to serial data to be transmitted as part of the asynchronous data transmission stream.

BRIEF DESCRIPTION OF THE DRAWINGS

A better understanding of the present invention can be obtained when the following detailed description of the preferred embodiment is considered in conjunction with the following drawings, in which.

Figure 1:
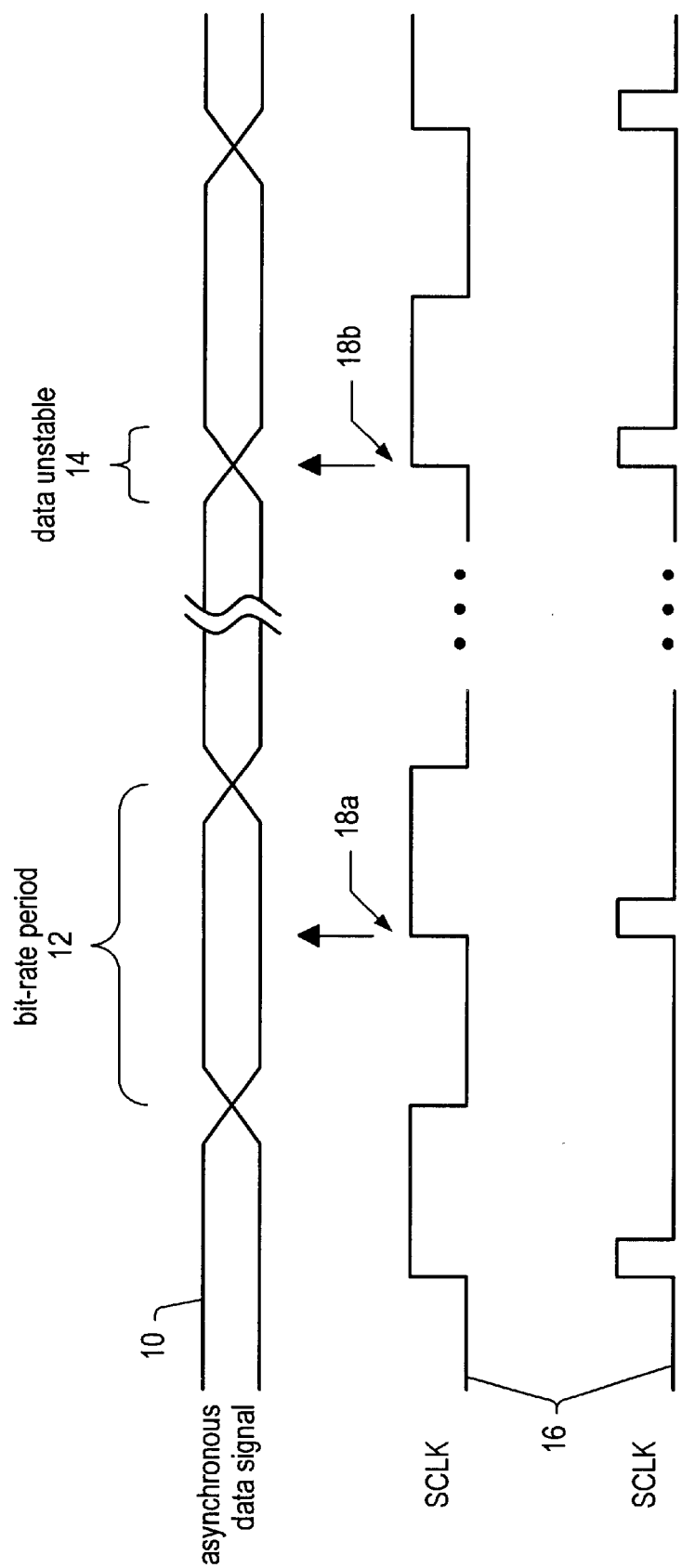
FIG. 1 illustrates a timing diagram showing an asynchronous data signal and a clock signal for sampling the asynchronous data signal.

While the invention is susceptible to various modifications and alternative forms specific embodiments are shown by way of example in the drawings and will herein be described in detail. It should be understood however, that drawings and detailed descriptions thereto are not intended to limit the invention to the particular form disclosed. But on the contrary the invention is to cover all modifications, equivalents and alternatives following within the spirit and scope of the present invention as defined by the appended claims.

DETAILED DESCRIPTION OF THE PRESENT INVENTION

Turning now to the drawings, FIG. 1 illustrates a timing diagram showing an asynchronous data signal 10 and a clock signal 16 for sampling the asynchronous data signal 10. Note that two alternative versions of clock signal 16 are illustrated in FIG. 1. One version shows a clock signal having a symmetrical duty cycle whereas the other version shows a clock signal with an asymmetrical duty cycle. These two versions of the clock signal are illustrated to show that the duty cycle of the sampling clock is not important. Any clock signal providing a periodic edge for sampling may be employed. The clock signal may have a symmetrical duty cycle as illustrated by the first clock signal or the clock signal may comprise periodic sample pulses as shown in the second illustrated clock signal 16.

The asynchronous data signal 10 may be a serial digital data stream having a bit-rate period 12. Bit-rate period 12 corresponds inversely to the frequency at which data is communicated by asynchronous data signal 10. For a serial digital data signal a different bit of data is transmitted every bit-rate period. Asynchronous data signal 10 is represented by both high and low logic level lines since the value of each bit of the asynchronous data signal 10 is unknown until sampled by sampling clock 16. The device receiving asynchronous data signal 10 may sample the data signal on edges 18 of the sample clock 16. If the sampling edge 18 of sample clock 16 occurs at a time when data on the asynchronous data signal 10 is stable, then the data will be sampled correctly as indicated at 18a. However, data may not always be stable on asynchronous data signal 10. For example, when data is transitioning from one value to another, e.g. from a zero to a one, the data may be unstable for an amount of time as represented by reference numeral 14. The data may be unstable during this time due to ringing, voltage ramp-up, etc. During the data unstable time 14, the data signal may be at an intermediate logic level or may be rapidly oscillating between logic levels or in some other metastable condition. Therefore, if the data signal 10 is sampled during the unstable time 14, the sample data may be incorrect. Since data signal 10 is asynchronous to sample clock 16, even though the frequency of sample clock 16 is approximately matched to the bit-rate frequency of data signal 10, due to phase drift a sample edge of sample clock 16 may occur during an unstable data potion 14 as indicated by reference numeral 18b. Therefore, a receiving device that uses an internal sampling clock to sample a data stream that is asynchronous to the sample clock cannot guarantee that the sampled data will be correct without taking additional measures to insure proper sampling.

Figure 2:
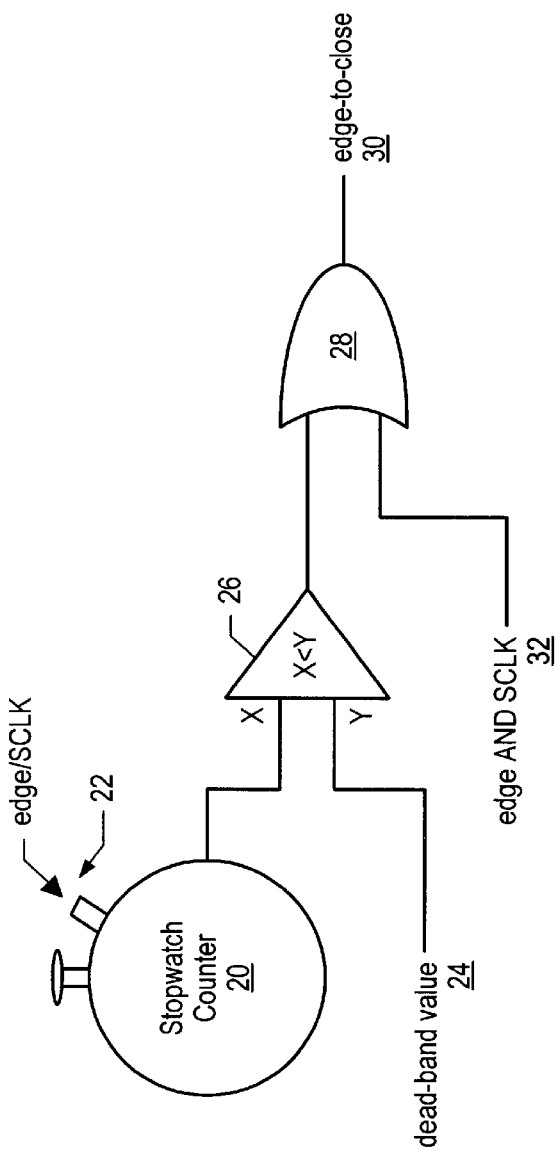
FIG. 2 is a block diagram illustrating an apparatus for detecting when a sample clock edge has drifted too close to data transitions such that the data sample may be incorrect.

Turning now to FIG. 2 a block diagram is provided illustrating an apparatus for detecting when the sample clock edge has drifted too close to data transitions such that the data sample may be incorrect. A counter 20 is provided to count the time between sample edges of the sample clock 16 and data transitions of the asynchronous data signal 10. Counter 20 is clocked by a high speed clock that has a frequency at least twice as fast as the bit rate of data signal 10. Counter 20 receives signals indicative of when a transition, or edge, occurs on asynchronous data signal 10 and when a sample edge of sample clock 16 occurs, as indicated at reference numeral 22. Control input 22 restarts the counter whenever one of these events occurs. Thus counter 20 may be thought of as a stop watch that measures the time between consecutive occurrences of a transition in data signal 10 or sample clock 16. Counter 20 outputs a count value measuring the time between a sample clock edge and a data signal transition edge to comparitor 26. Comparitor 26 compares this count value to a dead-band value 24. Dead-band value 24 is a predetermined value indicating the minimum time between a transition on data signal 10 and a sample edge of sample clock 16 for a valid sample to occur. Comparitor 26 checks whether or not this minimum spacing or dead-band value 24 is violated.

The output of comparitor 26 is input to OR gate 28 which asserts edge-too-close signal 30 if a sample edge of sample clock 16 occurs too close to a data transition edge of data signal 10. Another input 32 of OR gate 28 causes edge-too-close signal 30 to automatically be asserted if a data transition edge occurs on data signal 10 concurrently with a sample edge of sample clock 16. Edge-too-close signal 30 may be used to alert other function blocks of the receiving device that the most recent sample may be incorrect. Thus, the edge-too-close signal 30 may be used to cause the data signal 10 to be resampled. Also, edge-too-close signal 30 may indicate when the phase for sample clock 16 needs to be adjusted so that the next sample edge will occur during a stable data portion of data signal 10. Note that FIG. 2 is merely illustrative of one embodiment for detecting when a sample edge occurs too close to a data transition to assure that the sampled data is correct. Other implementations are contemplated. For example, OR gate 28 and input 32 may not be necessary if the counter 20 and comparitor 26 detect when the data transition edge and sample edge occur concurrently. Any circuit implementation which performs the described functionality is contemplated.

Figure 3:
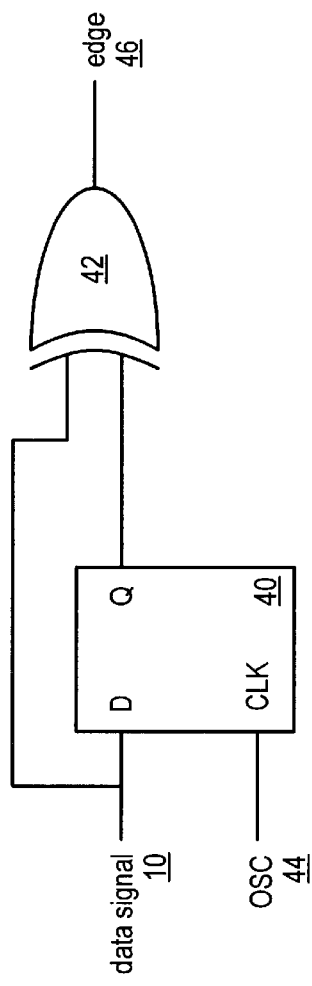
FIG. 3 is a logic diagram illustrating an example of a logic circuit that may be used to detect data transition edges of a data signal.

Turning now to FIG. 3 a logic diagram is provided illustrating an example of a logic circuit that may be used to detect data transition edges of data signal 10. A D-flip-flop 40 receives data signal 10 at its D-input. A high speed clock 44 is provided to the clock input of D-flip-flop 40. High speed clock 44 may be the same clock that runs counter 20 of FIG. 2. Preferably high speed clock 44 runs at a frequency at least twice that of the data bit rate of data signal 10. Data signal 10 is also provided to one input of exclusive OR gate 42. The other input to exclusive OR gate 42 is provided by the Q output of flip-flop 40. Exclusive OR gate 42 drives the edge signal 46 which indicates when a data transition occurs on data signal 10.

D-flip-flop 40 samples data signal 10 according to the high speed clock 44. Data signal 10 may be provided to D-flip-flop 40 by another flip-flop that samples the external asynchronous data signal according to the high speed clock 44. Exclusive OR gate 42 functions to compare the current state of data signal 10 to the previous state of data signal 10 as indicated by the Q output of D-flip-flop 40. If the state of data signal 10 has changed, then exclusive OR gate 42 asserts edge signal 46. If the state of data signal 10 has remained the same, then exclusive OR gate 42 does not assert edge signal 46. Note that FIG. 3 is merely illustrative of one example of a logic circuit that may be used to detect data transitions on an asynchronous data signal. Other implementations are contemplated. Any circuit that may provide a signal indicative of when asynchronous data signal 10 transitions from one state to another may be employed.

Figure 4A:
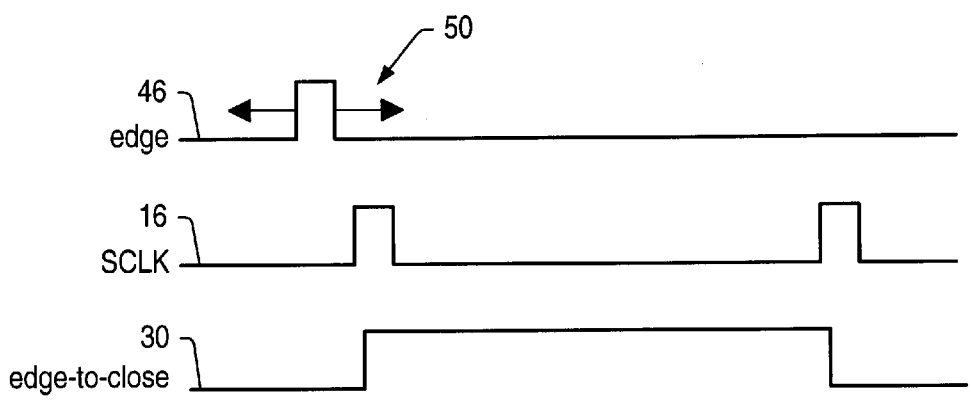
FIGS. 4A–4C are timing diagrams illustrating three cases in which a sample edge of a sample clock occurs too close to a data edge of a data signal.
Figure 4B:
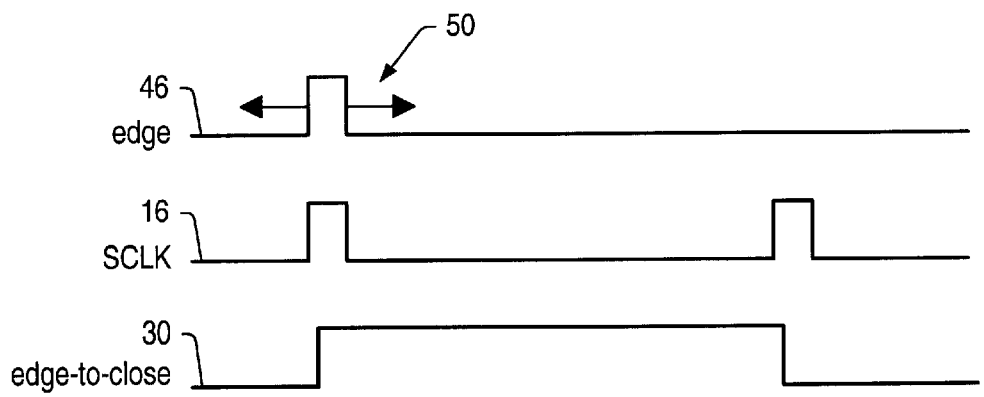
Figure 4C:
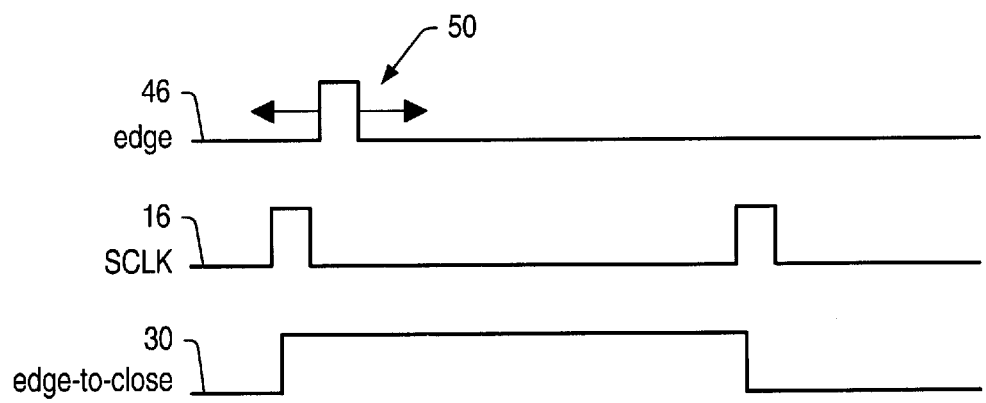

Turning now to FIGS. 4A–4C, timing diagrams are provided illustrating three cases in which a sample edge of the sample clock 16 occurs too close to a data edge of data signal 10. The time at which the sample clock 16 transitions for sampling the data signal is indicated by the SCLK 16 pulses in FIGS. 4A–C. An edge signal 46 indicates the time at which a transition occurs on data signal 10. Arrows 50 indicate the dead-band on either side of the data transition edge. If the SCLK 16 sample transition occurs within the dead zone 50 then edge-too-close signal 30 is asserted to indicate that the data was sampled too close to a transition to be guaranteed to be valid. FIG. 4A illustrates the case of when the data is sampled according to SCLK 16 after a transition on data signal 10, as indicated by edge signal 46, but within dead zone 50 so that the data may have been sampled too close to the data transition and thus may not be valid. Edge-too-close signal 30 is shown to remain asserted until the next sample clock pulse. However, this is merely one embodiment. Edge-too-close signal 30 may remain asserted for a shorter period of time such as for just the duration of one high speed clock.

FIG. 4B illustrates the case of when a data transition is detected concurrently with a sample clock transition. Since the data sample may not be valid, edge-too-close signal 30 is asserted. Similarly, FIG. 4C illustrates the case of when a sample transition occurs too close to before edge signal 46 is asserted, indicating that the sample clock sampled data too close to a data transition on data signal 10. Again, edge-too-close signal 30 is asserted. Note that in all three illustrations, the second sample clock transition occurs at a time relatively far away from a data transition on the data signal and thus the edge-too-close signal 30 is unasserted since the data sample is presumed to be valid.

Figure 5:
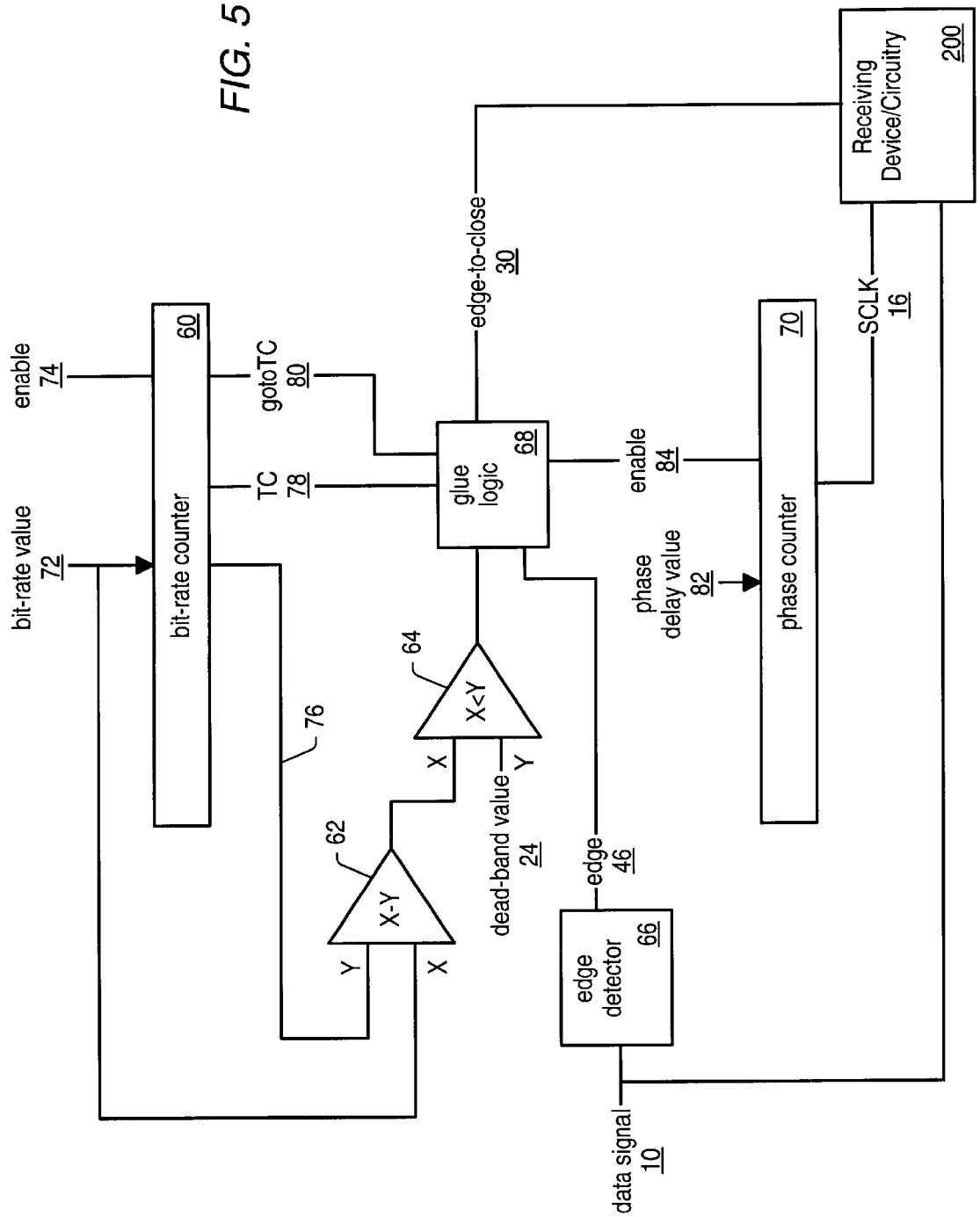
FIG. 5 is a block diagram illustrating a clock synchronizer for synchronizing a sample clock to an asynchronous data signal and for detecting when a sample clock transition occurs too close to a data transition on the data signal.

Turning now to FIG. 5, a block diagram is provided illustrating a clock synchronizer for synchronizing a sample clock 16 to an asynchronous data signal 10 and for detecting when a sample clock 16 transition occurs too close to a data transition on data signal 10. A bit-rate counter 60 provides a count clock signal 78 having a frequency approximately equal to the bit rate of the asynchronous data signal 10. Bit-rate counter 60 may be clocked by a high speed clock that is at least twice the frequency of the data bit rate of data signal 10 and preferably at a much higher frequency than data signal 10. Bit-rate counter 60 may be programmed with a bit-rate value 72 that serves as a divide-by value to produce clock signal 78 at a frequency of the high speed clock divided by bit-rate value 72. Clock signal 78 may be a symmetrical clock signal or may be a single pulse such as provided by the terminal count signal of a counter indicating when the counter has reached the count indicated by bit-rate value 72 or has counted down to zero from the bit-rate value 72. In summary, bit-rate counter 60 may be programmable by loading in a bit-rate value 72 such that the frequency of clock signal 78 may be adjusted to approximately match that of the data signal 10. If it is desired to receive a data signal 10 at a different frequency, bit-rate counter 60 may simply be programmed with a new bit-rate value 72 to match the new frequency of data signal 10. Bit-rate counter 60 may be reprogrammed dynamically if, for example, the frequency of data signal 10 changes dynamically. Bit-rate counter 60 may be enabled by an enable signal 74.

A phase counter 70 is provided to generate sample clock 16. Phase counter 70 may be programmed with a phase delay value 82 such that phase counter 70 generates SCLK 16 at the same frequency as clock signal 78 from bit-rate counter 60, but delayed by a phase delay as specified by phase delay value 82. Phase counter 70 may be enabled to start counting by enable signal 84 driven by glue logic 68. Enable signal 84 may be driven active upon active transitions of clock signal 78 such that SCLK 16 produced by phase counter 70 matches the frequency of clock signal 78 and thus matches the frequency of data signal 10.

In one embodiment, when bit-rate counter 60 counts down from bit-rate value 72 to zero, a terminal count signal (the clock signal 78) is driven which starts phase counter 72 counting down from phase delay value 82 such that SCLK 16 is asserted at a phase delay from when terminal count signal 78 is asserted. Thus, SCLK 16 may be a delayed version of terminal count or clock signal 78.

SCLK 16 may be synchronized to data signal 10 so that transitions of SCLK 16 will indicate times at which data signal 10 is valid, as follows. A subtracter 62 subtracts the current count 76 as provided by bit-rate counter 60 from bit-rate value 72. Thus, subtracter 62 functions to provide a measurement of the difference between bit-rate value 72 and the current count value 76 of bit-rate counter 60. The output of subtracter 62 is received by comparitor 64 which functions to compare whether or not the difference as determined by subtracter 62 is less than dead-band value 24. Edge detector 66 is provided to detect when data transitions on data signal 10. Edge detector 66 provides an edge signal 46 which is indicative of when a data transition has occurred on data signal 10. Edge detector 66 may be implemented as shown in FIG. 3, for example. The output of comparitor 64 and edge signal 46 are received by glue logic 68. Glue logic 68 functions to cause the phase of SCLK 16 to be adjusted when comparitor 64 indicates that an SCLK transition will occur within dead-band value 24 of a data transition as indicated by edge signal 46. If a sample transition of sample clock 16 occurred or would occur too close to a data edge of data signal 10 then glue logic 68 may adjust the phase of SCLK 16 by restarting phase counter 70 and bit-rate counter 60. Glue logic 68 may also assert edge-too-close signal 30 to indicate that the current sample may be invalid and corrective action may need to be taken by the receiving device 200.

In one embodiment, glue logic 68 adjusts the phase of SCLK 16 on each occurrence of a transition on data signal 10 by resetting phase counter 70 and bit-rate counter 60 each time edge signal 46 is asserted. Thus, if the sample edge of SCLK 16 has drifted too close to data transitions of data signal 10, the phase of SCLK 16 will be moved away from the transition point of data signal 10 by approximately the amount of phase delay value 82. This will occur since terminal count 78 of bit-rate counter 60 approximately matches the bit rate of data signal 10. When bit-rate counter 60 and phase counter 70 are reset, the count signal 78 from bit-rate counter 60 will correspond to times at which transitions on data signal 10 may be expected and SCLK 16 will be delayed from that point by phase delay value 82. Phase delay value 82 is chosen such that transitions of SCLK 16 will occur far enough from transitions of data signal 10 such that data samples will be valid.

When the phase of sample clock 16 is readjusted upon each transition of data on data signal 10 as indicated by edge signal 46, the case illustrated in FIG. 4A will not occur. This is because when edge 46 is detected, the phase of SCLK 16 will be adjusted such that the transition on SCLK 16 will occur at the phase delay from the edge signal 46. Due to this adjustment, the sample transition of SCLK 16 will not occur during dead-band 50 as shown in FIG. 4A, but instead will be delayed by phase delay value 42 from the edge transition 46 so that the sampled transition occurs outside of dead zone 50 when data signal 10 is valid. If a sample transition of SCLK 16 occurs concurrently with or before an edge on data signal 10 as indicated by edge signal 46 then the sample may be invalid. In this case the edge-too-close signal 30 will be asserted by glue logic 68 to warn that the sample may be invalid. The next sample transition of SCLK 16 will be phase adjusted to sample at a point when data signal 10 should be valid. Thus, in the embodiment where the phase of sample clock 16 is adjusted each time an edge is detected on data signal 10, an edge-too-close violation will normally only occur in the cases of FIGS. 4B and 4C. The case of FIG. 4A will be prevented by detecting the violation before it happens and adjusting the sample clock outward from the data transition edge so that no dead-band violation occurs. Also, a bad sample signal or edge-too-close signal 30 may be generated in the cases of FIGS. 4B and 4C to indicate that the current samples may be invalid. Also, the cases of FIGS. 4B and 4C may be prevented for future samples by adjusting the phase of SCLK 16 so that the next sample transitions of SCLK 16 will be properly phase adjusted from the time at which data transitions on signal 10 may be expected so that data signal 10 is sampled at times when data is valid.

In some embodiments, dead-band value 24 may be chosen so that the phase is readjusted when a sample transition of SCLK 16 occurs close to an edge of data signal 10, but not so close that data sample error may occur. In this way the phase may be readjusted to prevent bad samples before the phase of SCLK 16 has drifted too close to data transitions, so that inaccurate samples may be avoiding entirely. Dead-band value 24 may be a programmable value stored in a register so that it may be adjusted according to the requirements of a given application. Typically, phase delay value 82 is chosen to phase shift SCLK 16 a certain portion into the bit period of data signal 10 where the data will always be valid, e.g. one-third of a one-half of the bit period of data signal 10.

As described above, the phase of SCLK 16 is adjusted by restarting phase counter 70 and bit-rate counter 60. Restarting bit-rate counter 60 may be accomplished by glue logic 68 asserting a goto terminal count signal 80 which causes bit-rate counter 60 to assert terminal count 78 and restart counting from bit-rate value 72. The assertion of terminal count signal 78 by bit-rate counter 60 causes glue logic 68 to assert enable signal 84 which starts phase counter 70 to begin counting from phase delay value 82. Thus, when an edge is detected by edge detector 66, the bit-rate counter 60 will be synchronized to the edge signal 46 and SCLK 16 will be delayed from bit-rate counter 60 by phase delay value 82. Thus, bit-rate counter 60 will approximate the bit period of data signal 10 and SCLK 16 will be shifted by the phase delay 82 into the bit period of data signal 10 at a point at which data will be valid. This embodiment also has the advantage of obtaining immediate synchronization when an edge is detected on the data signal.

It is noted that the implementation shown in FIG. 5 is merely illustrative and is not intended to limit the present invention to the specific structure shown. Any circuitry capable of determining when a sample edge occurs too close to a data transition edge and readjusting the phase of the sample edge accordingly may be employed. However, one advantage of implementations such as that of FIG. 5, is that it is comprised of functional blocks such as counters and comparitors that are often optimized for many FPGA and gate array cell architectures. The use of such optimized functional blocks may facilitate porting the design to other technologies, architectures, etc. and/or scaling the size and/or speed of the design.

Figure 6:
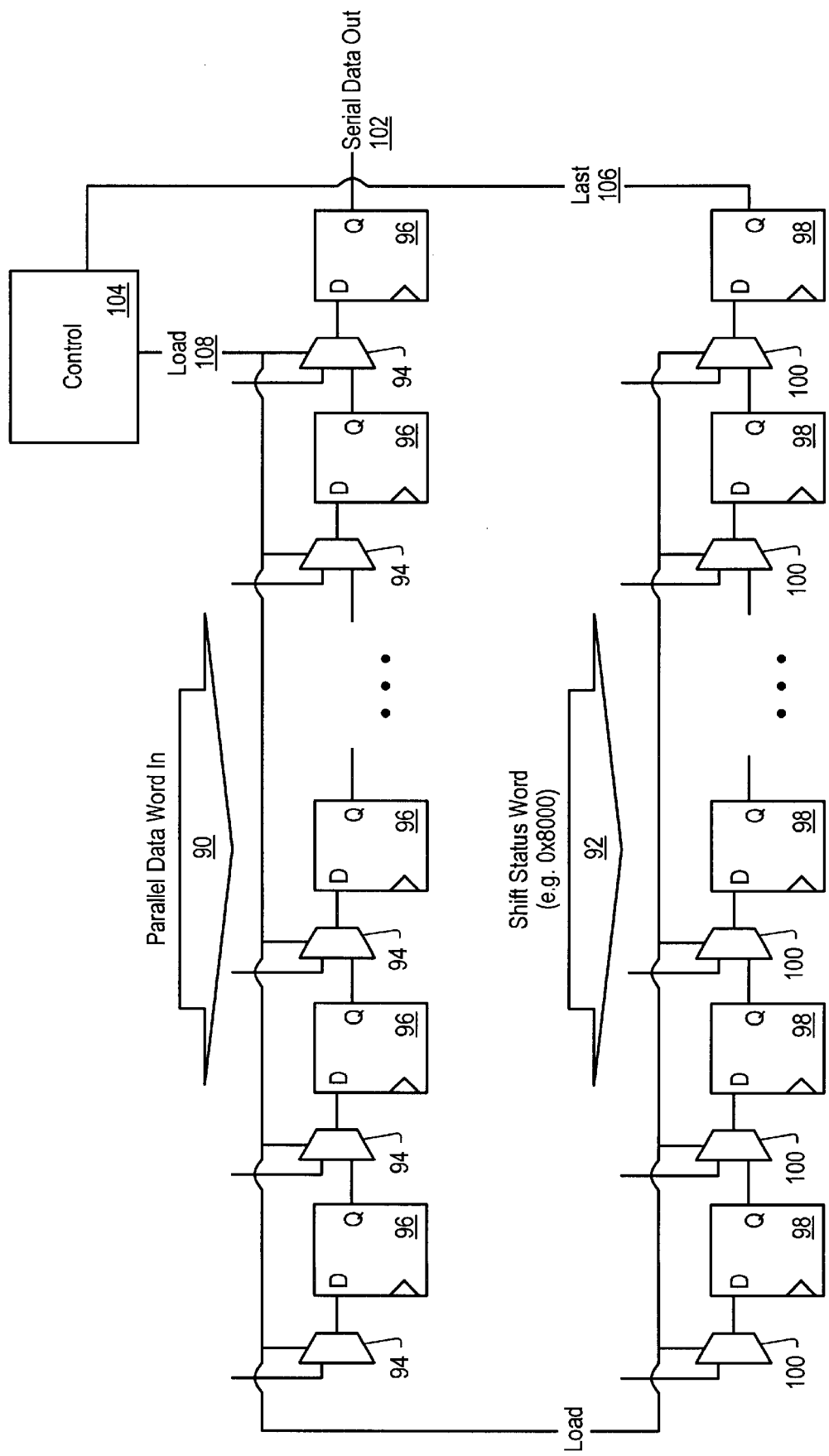
FIG. 6 illustrates a parallel-to-serial converter.

Turning now to FIG. 6, a parallel-to-serial converter is illustrated. The parallel-to-serial converter includes a first shift register having a series of flip-flops 96. This first shift register is configured to receive a parallel data word provided by parallel data word in logic 90. Each flip-flop 96 receives its input from a multiplexer 94. The multiplexer 94 for each flip-flop selects between the output of the previous flip-flop or a bit of the parallel data word to be loaded from parallel data word in logic 90. The multiplexers 94 are controlled by a load signal provided by control logic 104.

A second shift register including a second series of flip-flops 98 is also provided. Each flip-flop 98 receives its input from a multiplexer 100. Each multiplexer 100 selects between the output of the previous flip-flop 98 or a shift status word provided by shift status word logic 92. The second shift register is configured to track when the parallel data word loaded in the first shift register has been completely shifted out of the first shift register.

The parallel-to-serial converter of FIG. 6 operates as follows. Flip-flops 96 of the first shift register and flip-flops 98 of the second shift register each receive a clock signal. A parallel data word may be loaded in to the first shift register from parallel data word in logic 90. Control logic 104 asserts load signal 108 which causes multiplexers 94 to select the parallel data word bits as their inputs. Thus, each multiplexer 94 provides one bit of the parallel data word to the input of its respective flip-flop 96. When each flip-flop receives a clock edge, the bits are latched in to the flip-flops 96 and control logic 104 unasserts load signal 108 so that multiplexers 94 switch to select the output of the preceding flip-flop to provide as the input to the multiplexers' respective flip-flop 96. On each subsequent clock edge the bits of the parallel data word are shifted from one flip-flop to the next in the first shift register. The least significant bit remaining in the first shift register is shifted out on each clock edge as serial data output signal 102. In this manner a parallel data word is converted to the serial data output 102.

The second shift register tracks the status of the data conversion taking place in the first shift register. When the parallel data word is loaded into the first shift register, a shift status word is loaded from shift status word logic 92 into the second shift register. When load signal 108 is asserted, each multiplexer 100 selects a bit of the shift status word as its input to provide to the input of its respective D-flip-flop 98. The shift status word will be shifted in the second flip-flop in the same manner that the parallel data word is shifted in the first flip-flop. However, the shift status word is chosen such that the second shift register will indicate when the last bit of the parallel data word has been shifted out of the first shift register. This may be accomplished by choosing a shift status word that comprises a number of bits equal to the length of the parallel data word being converted in the first shift register. All bits of the shift status word may be set to zero except the most significant bit. Thus, as the parallel data word is shifted out of the first shift register, zeros will be shifted from the second shift register until the last bit of the parallel data word is shifted out of the first shift register at which time a one will be shifted out of the second shift register causing last signal 106 to be asserted. Last signal 106 is provided to control logic 104 which may then assert load signal 108 in response to the assertion of last signal 106 in order to cause the next parallel data word to be converted to be loaded into the first shift register and the status word to be loaded into the second shift register.

The number of flip-flops connected in series in the first shift register is chosen such that the length of the shift register corresponds to the maximum size of the parallel data word to be converted. In other words, if a 32 bit word is the largest word to be converted, 32 shift registers 96 may be provided for the first shift register. The word conversion length may be changed by simply loading a one in a different flip-flop location in the second shift register. The length of the second shift register matches that of the first shift register. If a 16 bit word is to be converted, for example, then the status word 0x8000 may be loaded into the second shift register. Thus a one will not be shifted out of the second shift register until 16 bits have been shifted out of the first shift register. If it is desired to change the word conversion length to 8 bits then the status word 0x0080 may be loaded into the second shift register. Thus, the parallel-to-serial converter of FIG. 6 is extremely flexible in the size of parallel data words that may be converted to serial data and the word conversion length may be changed dynamically by simply loading a different status word into the second shift register.

Figure 7:
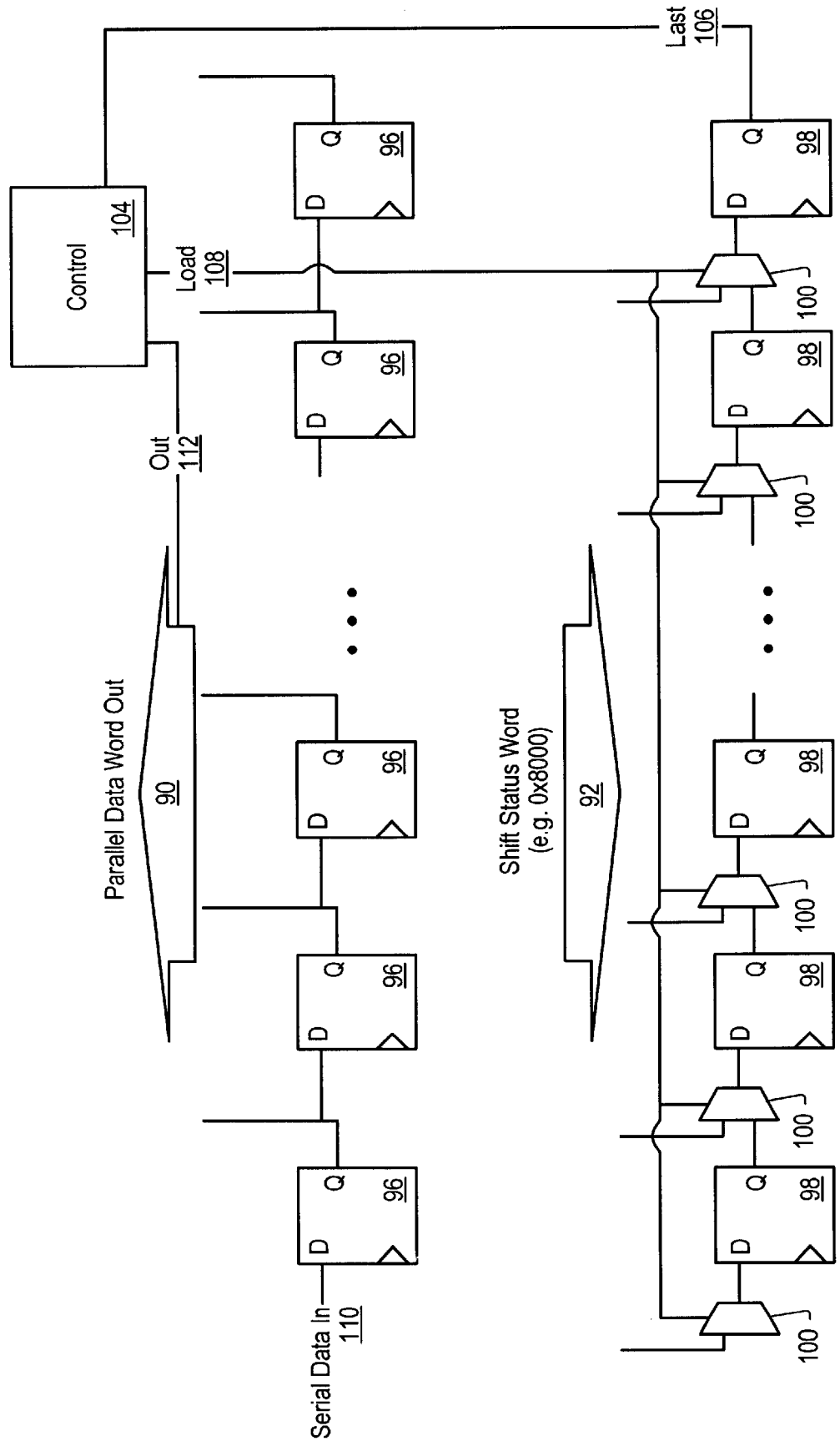
FIG. 7 illustrates a serial-to-parallel converter.

Turning now to FIG. 7, a serial-to-parallel converter which operates on the same principles as the parallel-to-serial converter of FIG. 6 is illustrated. Again a first shift register is provided having a series of connected flip-flops 96. A second shift register includes series connected flip-flops 98. A first flip-flop 96 of the first shift register receives a serial data in signal 110. The output of each flip-flop 96 in the first shift register is coupled to the input of the next flip-flop 96 in the first shift register except that the input of the first flip-flop is connected to the serial data in signal and the output of the last flip-flop simply provides and output for the last bit of the converted data word. The second shift register may be configured similarly to the second shift register of FIG. 6. Each flip-flop 98 receives its input from a multiplexer 100 which selects between the output of the previous flip-flop 98 or a bit of a status word provided by status word logic 92.

The serial-to-parallel converter of FIG. 7 operates as follows. As the flip-flops 96 of the first shift register are clocked, a serial data word provided by serial data in signal 110 is shifted into the first shift register bit by bit. When the serial data has been shifted in to the desired parallel data word length, control logic 104 asserts out signal 112 which causes parallel data word out logic 90 to accept a bit of the parallel data word from the output of each of the flip-flops 96 in parallel. The status word provided by status word logic 92 is correspondingly shifted in the second shift register such that the second shift register asserts last signal 106 when the correct amount of serial data has been shifted into the first shift register. Last signal 106 is received by control logic 104 and is used by control 104 to determine when to assert out signal 112. Control logic 104 then may also assert load signal 108 to reload the shift status word into the second shift register so that conversion of the next serial data may proceed.

Again the length of the shift registers is selected to correspond to the maximum parallel width of the parallel data word to be converted to. The serial-to-parallel conversion length may be changed by simply changing the "one bit" location in the shift status word loaded into the second shift register.

Figure 8:
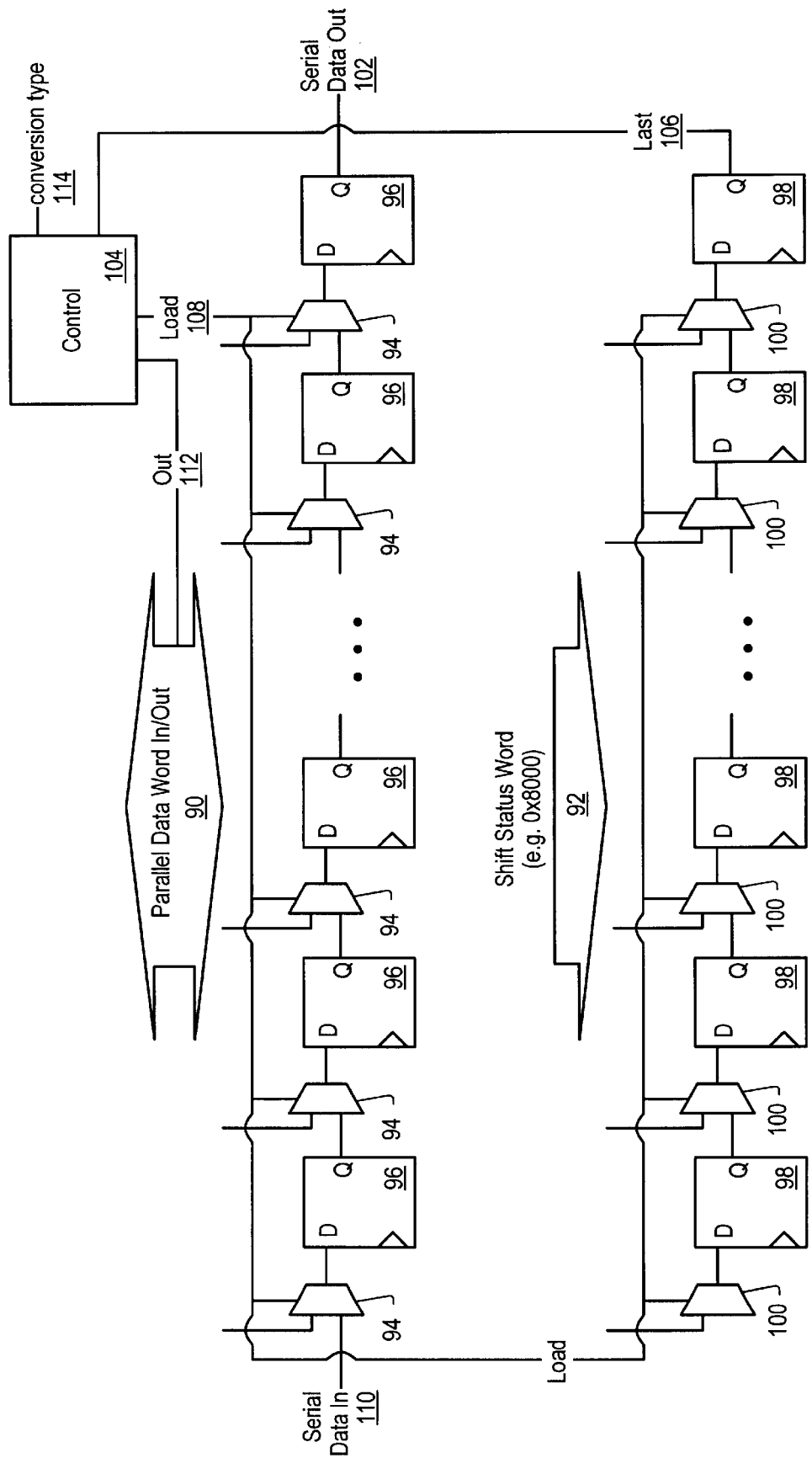
FIG. 8 illustrates a data converter that may convert from serial-to-parallel or from parallel-to-serial data formats.

Turning now to FIG. 8, a data converter is illustrated which operates similarly to the converters of FIGS. 6 and 7. The data converter of FIG. 8 may convert from serial-to-parallel or from parallel-to-serial according to a conversion type signal 114 provided to control logic 104. When parallel-to-serial conversion is selected by conversion type signal 114, the data converter of FIG. 8 operates as described for the parallel-to-serial converter of FIG. 6. When conversion type signal 114 indicates that serial-to-parallel conversion is to be performed, the data converter of FIG. 8 operates as described for the serial-to-parallel converter of FIG. 7. Again, the shift register lengths are selected to correspond to the maximum length of the parallel data word to be converted. Also, the conversion length ma be easily changed by simply loading a different shift status word value having a "one bit" location corresponding to the desired conversion length.

The data converters of FIGS. 6–8 may easily be scaled to different conversion lengths and to different process technologies and device architectures without incurring performance loss. This is because the data converters of FIGS. 6–8 employ series-connected shift registers to perform both the data conversion and the data conversion status tracking functions. Thus, the critical time in the data converters of FIGS. 6–8 is the clock-to-out time of the flip-flops of the first and second shift registers. Since almost all semiconductor processes and device architectures are optimized to provide fast flip-flop clock-to-out times, the device type or process used to implement the data converters of FIGS. 6–8 may be changed without having to significantly redesign the data converter circuitry. This may be especially valuable in the early design stages when the particular process or device architecture has not yet been selected. The same may be also be true for the clock synchronization logic of FIGS. 2 and 5 which employ counters and comparitors that are also often optimized for many processes and devices architectures.

The sample clock synchronization logic for receiving an asynchronous data signal as described in FIGS. 1–5 and the data converters as described in FIG. 6–8 may be used in conjunction in a device for receiving and/or transmitting asynchronous data. For example, the sample clock synchronization logic of FIG. 5 may be used to determine when to sample serial data signal 10 to provide that data as the serial data input 110 to the data converter of FIG. 7 or 8. Sample clock 16 may be used to determine when to clock the shift registers of the data converter so that a valid data bit of the serial data signal 10 is shifted in as the serial data input 110 into the first shift register of the data converter. Also, the converter of FIGS. 6 or 8 may be used to convert parallel data to serial data to be transmitted in a serial data communication system or application.

It should be understood that while certain potential advantages have been discussed, these advantages should not be considered to necessarily be characteristic of the described embodiments or limiting in any way. Although the system and method of the present invention has been described in connection with several representative embodiments, it is not intended to be limited to the specific forms set forth herein, but on the contrary, it is intended to cover such alternatives, modifications, and equivalents, as can be reasonably included within the spirit and scope of the invention as defined by the appended claims.

I claim:

1. An apparatus for receiving an asynchronous data signal, comprising:
    a clock signal generator configured to generate a clock signal having a frequency approximately equal to the bit-rate of the asynchronous data signal;
    circuitry configured to receive the asynchronous data signal at times determined by a transition of said clock signal;
    an edge detector configured to detect a transition of the asynchronous data signal; and
    a dead-band detector coupled to said clock signal generator and to said edge detector, said dead-band detector configured to detect when said transition of said clock signal occurs within a predetermined amount of time of said transition of the asynchronous data signal;
        wherein the phase of said clock signal is adjusted if said transition of said clock signal occurs within said predetermined amount of time of said transition of the asynchronous data signal.

2. The apparatus as recited in claim 1, wherein said dead-band detector is further configured to assert a bad-sample signal when said transition of said clock signal occurs within said predetermined amount of time of said transition of the asynchronous data signal.

3. The apparatus as recited in claim 2, wherein said circuitry configured to receive the asynchronous data signal resamples the asynchronous data signal in response to said bad-sample signal.

4. The apparatus as recited in claim 1, wherein said edge detector asserts an edge signal upon detection of said transition of the asynchronous data signal, and wherein the phase of said clock signal is adjusted in response to said edge signal.

5. The apparatus as recited in claim 4, wherein said dead-band detector is further configured to assert a bad-sample signal when said transition of said clock signal occurs within said predetermined amount of time before assertion of said edge signal or concurrently therewith.

6. The apparatus as recited in claim 5, wherein said bad-sample signal indicates to said circuitry configured to receive the asynchronous data signal that a current sample of the asynchronous data signal may be incorrect.

7. The apparatus as recited in claim 1, wherein said clock signal generator comprises:
a bit-rate counter configured to generate a count signal corresponding to the bit-rate of the asynchronous data signal; and
a phase counter adapted to generate said clock signal at a phase delay from said count signal.

8. The apparatus as recited in claim 7, wherein said bit-rate counter and said phase counter are reset in response to said transition of the asynchronous data signal.

9. The apparatus as recited in claim 7, wherein said phase counter comprises a programmable counter adapted to receive a phase value corresponding to said phase delay.

10. The apparatus as recited in claim 7, wherein said bit-rate counter comprises a programmable counter adapted to receive a bit-rate value corresponding to the bit-rate of the asynchronous data signal.

11. The apparatus as recited in claim 10, wherein said dead-band detector comprises:
a subtractor configured to subtract a count value from said bit-rate value and output the difference, wherein said count value is the count of said bit-rate counter; and
a comparitor configured to compare the difference from said subtractor to a dead-band value, wherein said difference indicates how close said transition of said clock signal occurs to said transition of the asynchronous data signal and said dead-band value represents said predetermined amount of time.

12. The apparatus as recited in claim 1, wherein said dead-band detector comprises a comparitor configured to compare a count value to a dead-band value, wherein said count value indicates how close said transition of said clock signal occurs to said transition of the asynchronous data signal and said dead-band value represents said predetermined amount of time.

13. The apparatus as recited in claim 1, wherein said circuitry configured to receive the asynchronous data signal comprises a serial-to-parallel converter.

14. The apparatus as recited in claim 13, wherein said serial-to-parallel converter comprises a shift register clocked by said clock signal.

15. A method for synchronizing a clock signal to an asynchronous data signal, comprising:
generating a clock signal, wherein the frequency of the clock signal is selected to be approximately equal to the bit-rate of the asynchronous data signal;
detecting a transition of the asynchronous data signal;
detecting if a sample transition of the clock signal occurs within a predetermined time of said transition of the asynchronous data signal and generating an indication thereof; and
adjusting the phase of the clock signal so that a next sample transition of the clock signal will occur a phase delay from said transition of the asynchronous data signal.

16. The method as recited in claim 15, wherein said generating a clock signal comprises:
counting for a time period corresponding to the bit-rate of the asynchronous data signal and generating a terminal count when said time period is reached;
counting for said phase delay from said terminal count; and
asserting the clock signal when said phase delay is reached.

17. The method as recited in claim 16, wherein said adjusting the phase of the clock signal comprises restarting said counting for a time period and said counting for said phase delay in response to said detecting a transition of the asynchronous data signal.

18. The method as recited in claim 16, wherein said generating a clock signal further comprises:
loading a first programmable counter with a bit-rate count value corresponding to the bit-rate of the asynchronous data signal; and
loading a second programmable counter with a phase delay count value corresponding to said phase delay.

19. The method as recited in claim 18, wherein said detecting if a sample transition of the clock signal occurs within a predetermined time of said transition of the asynchronous data signal, comprises:
subtracting a count value from said bit-rate count value and outputting the difference, wherein said bit-rate count value is provided by said counting for a time period; and
comparing the difference from said subtracting to a dead-band value, wherein said difference indicates how close said sample transition of the clock signal occurs to said transition of the asynchronous data signal and said dead-band value represents said predetermined amount of time.

20. The method as recited in claim 15, further comprising changing the frequency of the clock signal in response to a change in the bit-rate of the asynchronous data signal.

21. The method as recited in claim 20, wherein said changing the frequency of the clock signal comprises loading a new bit-rate count value into a counter.

22. The method as recited in claim 15, wherein said adjusting is performed in response to said detecting a transition of the asynchronous data signal, and wherein said phase delay is set so that after said adjusting, the next sample transition of the clock signal will occur when said asynchronous data signal is valid so that said clock signal is synchronized to said transition of the asynchronous data signal.

* * * * *